United States Patent [19]

Sakano et al.

[11] 4,387,270

[45] Jun. 7, 1983

[54] METHOD OF HARMONIZING THE IMPEDANCES OF AN AUDIO AMPLIFIER AND LOUDSPEAKER INTERCONNECTED THEREWITH

[75] Inventors: Hideki Sakano, Iwafunemachi; Shigeru Todokoro, Fujisawashi, both of Japan

[73] Assignee: Tokyo Shibaura Denki Kabushiki Kaisha, Kawasakishi, Japan

[21] Appl. No.: 211,187

[22] Filed: Nov. 28, 1980

[30] Foreign Application Priority Data

Mar. 24, 1980 [JP] Japan .................................. 55-37198

[51] Int. Cl.³ .............................................. H04R 3/00
[52] U.S. Cl. ............................... 179/1 F; 179/175.1 A
[58] Field of Search ................. 179/1 A, 1 F, 175.1 R, 179/175.1 A; 330/2, 291, 292, 75

[56] References Cited

U.S. PATENT DOCUMENTS

| | | | |
|---|---|---|---|
| 3,798,374 | 3/1974 | Meyers | 179/1 F |
| 3,821,473 | 6/1974 | Mullins | 179/1 F |
| 4,180,706 | 12/1979 | Bakgaard | 179/1 F |
| 4,276,443 | 6/1981 | Meyers | 179/1 F |
| 4,287,389 | 9/1981 | Gamble | 179/1 F |
| 4,335,274 | 6/1982 | Ayers | 179/1 F |

Primary Examiner—G. Z. Rubinson
Assistant Examiner—R. Lev
Attorney, Agent, or Firm—Finnegan, Henderson, Farabow, Garrett & Dunner

[57] ABSTRACT

A method of harmonizing the impedances of an audio amplifier and a loudspeaker interconnected therewith, the audio amplifier including a line amplifier and a positive feedback circuit for compensating for the counter electromotive force of the loudspeaker. A voice coil of the loudspeaker is mechanically driven for generating an electric signal at input terminals of the loudspeaker. Then, the amplification degree of the line amplifier or the positive feedback circuit is adjusted to reduce the signal voltage between the input terminals of the loudespeaker to a minimum, during the circulation of the generated signal through the positive feedback circuit and the line amplifier.

8 Claims, 2 Drawing Figures

METHOD OF HARMONIZING THE IMPEDANCES OF AN AUDIO AMPLIFIER AND LOUDSPEAKER INTERCONNECTED THEREWITH

FIELD OF THE INVENTION

This invention relates to a method for harmonizing the impedances of an audio amplifier and a loudspeaker interconnected therewith and, more particularly, to such a method wherein the audio amplifier includes a positive feedback for compensating for the counter electromotive force of the loudspeaker.

BACKGROUND OF THE INVENTION

A great number of improvements in audio equipment, for example, amplifiers or loudspeakers, have been made to produce sounds of higher fidelity. As a result, a recent amplifier or loudspeaker, individually, produces a good performance. However, when the amplifier and loudspeaker are combined, impedance mismatching between the amplifier and loudspeaker becomes a problem. That is, the impedance of the extension wires connecting the amplifier and the loudspeaker together adds to the impedance of the loudspeaker so that an output impedance of the amplifier becomes difficult to match with the whole of the load impedance, including the impedance of the loudspeaker and the extension wires. In such an impedance mismatching condition, an output signal voltage of the amplifier, as well as a counter electromotive force voltage of the loudspeaker, arises across the loudspeaker terminals. The counter electromotive force voltage has nonlinearity characteristics so that the loudspeaker is driven by an output signal voltage which is distorted by the counter electromotive force voltage.

Heretofore, an audio amplifier having a circuit automatically compensating a counter electromotive force of a loudspeaker by means of feedback has been rarely considered. Moreover, it has been found that there is needed a critical characteristic relationship between a line amplifier and a feedback means for compensating.

SUMMARY OF THE INVENTION

Accordingly, it is an object of the present invention to provide an effective, but simple, method for harmonizing the impedance of an audio amplifier and a loudspeaker interconnected therewith, the audio amplifier including a positive feedback circuit for compensating for the counter electromotive force of the loudspeaker.

The objects of the present invention are accomplished by mechanically driving a voice coil of the loudspeaker to generate an electrical signal and adjusting the amplification degree of a line amplifier of the audio amplifier or the positive feedback circuit during the circulation of the generated signal through the positive feedback circuit and the line amplifier for minimizing the voltage across the input terminals of the loudspeaker.

Additional objects and advantages of the present invention will become apparent to persons skilled in the art from a study of the following description of the accompanying drawings.

DESCRIPTION OF THE PREFERRED EMBODIMENT

Figure 1:
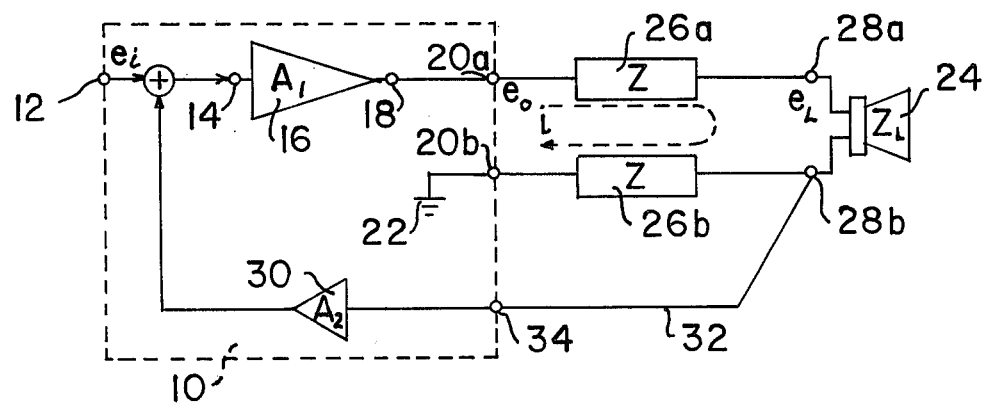
FIG. 1 shows a block diagram of a sound reproduction system in which the present invention may be utilized.

The present invention will be described in detail with reference to the accompanying drawings FIG. 1 and FIG. 2. Throughout the drawings, like reference numerals will be used to designate like or equivalent portions for the sake of simplicity of explanation.

Referring now to FIG. 1, there is shown a sound reproduction system including an audio amplifier to which this invention is to be applied. In FIG. 1, an audio amplifier 10 within a broken line is characterized by having a positive feedback means. A line input signal at a line input terminal 12 is supplied to an input terminal 14 of a line amplifier 16. An amplified signal derived from an output terminal 18 of line amplifier 16 is supplied to a line output terminal 20a. Output terminal 20b, is grounded. The line output signal arising across output terminals 20a and 20b is supplied to a loudspeaker 24 through a pair of like extension wires 26a and 26b. One loudspeaker terminal 28b, which is connected to grounded output terminal 20b, is further connected to a positive feedback circuit 30 in audio amplifier 10 through a feedback wire 32. Thus, a signal voltage at loudspeaker terminal 28b is positively fed back to the input of line amplifier 16.

In the above-described sound reproduction system, positive feedback circuit 30 may compensate the driving signal for loudspeaker 24. That is, if $e_o$, $e_L$, $Z$ and $Z_L$ denote the output voltage of audio amplifier 10, the driving voltage supplied to loudspeaker terminals 28a and 28b, the impedance of each of the like extension wires 26a or 26b, and the impedance of loudspeaker 24, respectively, then the following equation is obtained referring to the voltage $e_L$.

$$e_L = \frac{e_o \cdot Z_L}{2Z + Z_L} \qquad (1)$$

If again $e_i$, $i$, $A_1$ denote an input signal voltage for audio amplifier 10 at line input terminal 12, output current flowing through extension wires 26a and 26b and loudspeaker 24, and amplification degrees of line amplifier 16 and positive feedback means 30, respectively, then the following equation is obtained referring to the voltage $e_o$:

$$e_o = (e_i + A_2 i Z) A_1 \qquad (2)$$

$$= \left( e_i + A_2 Z \frac{e_o}{2Z + Z_L} \right) A_1$$

The equation (2) may be rearranged as follows:

$$e_o = \frac{e_i A_1}{\left(1 - A_1 A_2 \frac{Z}{2Z + Z_L}\right)} \qquad (3)$$

Then, the equation (1) may be rewritten as follows by substituting the equation (3):

$$e_L = \frac{e_i A_1}{\left(1 - A_1 A_2 \frac{Z}{2Z + Z_L}\right)} \cdot \frac{Z_L}{2Z + Z_L} \quad (4)$$

$$= \frac{e_1 A_1 Z_L}{Z_L + 2Z - A_1 A_2 Z}$$

In equation (4) the voltage $e_L$ exists regardless of loudspeaker impedance $Z_L$, under the condition that the following (5) is obtained:

$$2Z - A_1 A_2 Z = 0$$

that is, $$A_1 A_2 = 2 \quad (5)$$

In the above equation, the voltage $e_L$ is presented by the special equation (6) as follows:

$$e'_L = A_1 e_i \quad (6)$$

From the relation (6), the following description may be made. That is, driving voltage $e'_L$ at terminals 28a and 28b for loudspeaker 24 relates only to the amplification degree $A_1$ of line amplifier 16 and does not relate to the loudspeaker impedance $Z_L$ and the impedance of extension wires 26a and 26b. This means that the sound reproduced from loudspeaker 24 is free from any distortion accompanying a change of the loudspeaker impedance $Z_L$.

However, it is relatively difficult to get the relation (5) since the amplification degree of the line amplifier 16 and the positive feedback circuit 30 depend on each other. Generally, the amplification degree $A_1$ of the line amplifier 16 is set alone from a request of needed output power while the amplification degree $A_2$ of the positive feedback circuit 30 is determined depending on the amplification degree $A_1$ of the line amplifier 16. Therefore, the amplification degree $A_2$ of the positive feedback circuit 30 must be designed in the specified degree $2/A_1$ which is practically in a small decimal. It is, however, very difficult to decide correctly the amplification degree $A_2$ to such a specified degree as $2/A_1$. Further, mass production of the audio amplifiers, having desired characteristics for compensating, is difficult because the capacity of mass-produced parts, for example, transistors, resistors, or capacitors included in the audio amplifiers, is not uniform.

Figure 2:
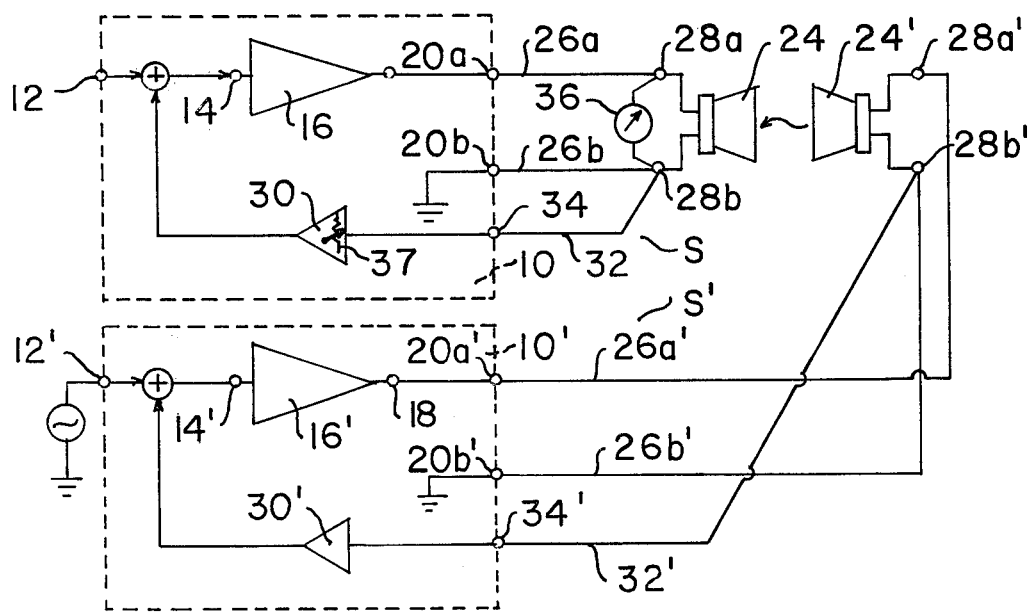
FIG. 2 shows a diagrammatic illustration of apparatus suitable for carrying out an embodiment of the present invention.

Referring now to FIG. 2, there is shown a diagrammatic illustration used for explaining the method of harmonizing the impedances of an audio amplifier and a loudspeaker interconnected therewith, the audio amplifier including a line amplifier and a positive feedback circuit for compensating for the counter electromotive force of the loudspeaker, according to the invention. As illustrated in FIG. 2, means are provided for mechanically driving a voice coil of the loudspeaker to generate an electrical signal. For purposes of illustration, two sound reproduction systems, such as defined in FIG. 1, are shown side by side as found in stereo sound reproduction systems. The second of the sound reproduction systems is used merely to produce a sound for driving a voice coil of a loudspeaker of the first. It is obvious, of course, that any other means could be used to produce a sound for driving a voice coil of a loudspeaker of the sound reproduction system, wherein the impedances are being harmonized, including electrically or magnetically driving the voice coil.

For this purpose, explanation of the construction of each system is omitted, by using like reference numerals without prime for one system and with prime for the other system for simplicity.

Then, an AC voltmeter 36 is connected between terminals 28a and 28b of loudspeaker 24 of one system S. After that, an input signal is applied to the other system S' so that diaphragm of loudspeaker 24 of the one system S is mechanically driven by an acoustic signal produced from loudspeaker 24' of other system S'. Therefore, an electrical signal is generated by the voice coil of loudspeaker 24 and is presented on terminals 28a and 28b. That is, loudspeaker 24 operates like a microphone. The voltage $V_L$ of the generated electrical signal on terminals 28a and 28b of loudspeaker 24 is indicated by voltmeter 36.

The voltage $V_L$ is given by an equation (7) as follows:

$$V_L = Z_o i \quad (7)$$

where $Z_o$ is a driving source impedance for loudspeaker 24 at terminals 28a and 28b, and i is a current flowing through the audio amplifier 10 on the basis of the generated signal. Further, the voltage $V_L$ may be presented as follows:

$$V_L = 2iZ + V_o \quad (8)$$

where Z is each impedance of the pair of extension wires 26a and 26b, and $V_o$ is a voltage across the pair of line output terminals 20a and 20b. The voltage $V_o$ is also an output voltage from line amplifier 16 which is supplied only a signal from positive feedback means 30 as an input signal. This results since the input signal to line input terminal 12 is obstructed as part of the method of harmonizing the impedances of the audio amplifier and the loudspeaker.

Accordingly, the following equation (9) is obtained:

$$V_o = iZ A_2 A_1 \quad (9)$$

because, a voltage drop $(-i \cdot Z)$ across extension wire 26b is added to the positive feedback circuit 30.

As a result, the equation (8) is rewritten as follows by substituting the equation (9)

$$V_L = 2iZ - iZ A_2 A_1 = iZ (2 - A_1 A_2) \quad (10)$$

From the equation (10) it appears that the condition $A_2 = 2/A_1$ is obtained when the voltage $V_L$ is zero. Or, when the amplification degree $A_2$ of positive feedback means 30 is adjusted in order that the voltage $V_L$ becomes zero, the amplification degree $A_2$ consequently comes to equal the degrees $2/A_1$. Therefore, the amplification degree $A_2$ of positive feedback circuit 30 can be properly adjusted by means of controlling any variable device, for example, a variable resister 37 participating in the amplification degree $A_2$, so that the AC voltmeter 36 points to zero. Actually, the amplification degree $A_2$ of positive feedback circuit 30 is adjusted in order that the pointed value of voltmeter 36 comes closest to zero, because some noise exists in line amplifier 16 and positive feedback circuit 30. As a result, the first reproduction system S can be adjusted for harmonizing the impedances since the driving voltage for loudspeaker 24 at terminals 28a and 28b relates only to the amplification degree $A_1$ of line amplifier 16 or the positive feed back circuit and does not relate to the loudspeaker's impedance $Z_L$ or to the impedance $Z_o$ of the pair of extension wires 26a and 26b.

Further, audio amplifier 10 or 10' of systems S and S', respectively, may be adjusted to the best condition by utilizing an optional loudspeaker and extension wires in the process of manufacturing at the factory because the relation $(A_2 - 2/A_1)$ is free from the loudspeaker's impedance $Z_L$ and the impedances Z of the pair of extension wires 26a and 26b.

The mechanical driving of the diaphragm of loudspeaker 24 or 24' may be practiced by any other mechanical force or sound, for example, voices of operators, noises in the environment, or tapping the diaphragm.

In the illustrative embodiment of FIG. 2, a voltmeter 36 is used for indicating the voltage across the input terminals of the loudspeaker. It is apparent that any convenient indicator could be used for reflecting the voltage or for showing that the voltage has reached a minimum, including a light emitting diode.

What is claimed is:

1. The method of harmonizing the impedances of an audio amplifier and a loudspeaker interconnected therewith, the audio amplifier including a line amplifier and a positive feedback circuit for compensating for the counter electromotive force of the loudspeaker, the method comprising:
   mechanically driving a voice coil of the loudspeaker to generate an electrical signal; and
   minimizing the voltage between the input terminals of the loudspeaker by adjusting the amplification degree of the line amplifier or the positive feedback circuit during the circulation of the generated signal through the positive feedback circuit and the line amplifier.

2. The method of harmonizing the impedances of an audio amplifier and a loudspeaker interconnected therewith according to claim 1 wherein said step of mechanically driving the voice coil of the loudspeaker is accomplished by tapping the diaphragm of the loudspeaker.

3. The method of harmonizing the impedances of an audio amplifier and a loudspeaker interconnected therewith according to claim 1 wherein said step of mechanically driving the voice coil of the loudspeaker is accomplished by a sound acting on the diaphragm of the loudspeaker.

4. The method of harmonizing the impedances of an audio amplifier and a loudspeaker interconnected therewith according to claim 3 wherein the sound is produced by another loudspeaker connected to another audio amplifier.

5. The method of harmonizing the impedances of an audio amplifier and a loudspeaker connected therewith according to claim 4 wherein said latter audio amplifier and said latter loudspeaker constitute a first audio amplifier and a first loudspeaker and wherein said method includes the step of utilizing a second audio amplifier and a second loudspeaker to complete a set of stereo apparatus with said first audio amplifier and first loudspeaker and wherein said second audio amplifier constitutes said another audio amplifier.

6. The method of harmonizing the impedances of an audio amplifier and a loudspeaker interconnected therewith according to the claim 1 wherein said step of minimizing the voltage between the input terminals of the loudspeaker includes connecting a voltage sensitive indicator between the input terminals of the loudspeaker before the step of mechanically driving a voice coil of the loudspeaker.

7. The method of harmonizing the impedances of an audio amplifier and a loudspeaker interconnected therewith according to the claim 6 wherein the indicator is a voltmeter.

8. The method of harmonizing the impedances of an audio amplifier and a loudspeaker interconnected therewith according to claim 6 wherein the indicator is a light emitting diode.

* * * * *